US006122175A

United States Patent [19]

Shieh

[11] Patent Number: 6,122,175
[45] Date of Patent: Sep. 19, 2000

[54] COMPACT FLASH CARD ADAPTER

[76] Inventor: Ron-Yen Shieh, P.O. Box 82-144, Taipei, Taiwan

[21] Appl. No.: 09/247,584

[22] Filed: Feb. 1, 1999

[51] Int. Cl.[7] .................... H05K 7/14; H01R 9/09

[52] U.S. Cl. .................... 361/737; 361/736; 361/752; 439/76.1; 439/945

[58] Field of Search .................... 361/683, 728, 361/736, 737, 752, 753, 807, 782; 439/76.1, 945–947; 235/492

[56] References Cited

U.S. PATENT DOCUMENTS

| | | | |
|---|---|---|---|
| 5,184,282 | 2/1993 | Kanrda et al. | 361/737 |
| 5,457,601 | 10/1995 | Georgopulos et al. | 361/686 |
| 5,608,607 | 3/1997 | Dittmer | 361/686 |
| 5,808,672 | 9/1998 | Wakabayashi et al. | 361/737 X |
| 5,820,414 | 10/1998 | Omori | 439/638 |
| 5,823,796 | 10/1998 | Bethurum | 439/76.1 |
| 5,984,731 | 11/1999 | Laity | 439/676 |

*Primary Examiner*—Jayprakash N. Gandhi
*Attorney, Agent, or Firm*—A & J

[57] ABSTRACT

A compact flash card adapter includes a casing, a printed circuit board fitted within the casing, a female compact flash card connector mounted on one side of the printed circuit board, a male PCMCIA card connector mounted on an opposite side of the printed circuit board, an indicator light installed on the printed circuit board and protruding out of the casing, a power switch arranged on the printed circuit board and protruding out of the casing, a power jack disposed on the printed circuit board and protruding out of the casing, and a voltage regulating IC mounted on the printed circuit board, whereby a user may connect a peripheral component with PCMCIA interface with the compact flash card connector of an electronic device.

2 Claims, 5 Drawing Sheets

COMPACT FLASH CARD ADAPTER

BACKGROUND OF THE INVENTION

1. Field of the Invention

This invention is related to a compact flash card adapter and in particular to one that allows a user to connect a peripheral component with PCMCIA interface with the compact flash card connector of an electronic device.

2. Description of the Prior Art

The Personal Computer Memory Card International Association (PCMCIA) was created to develop an interface specification to add peripheral components such as memory, modems, hard-drives, local area network (LAN) adapters, multimedia interface specifications etc. to notebook computers. The Association published a specification which defines an interface for a 68-pin device that is the size of a credit card. PCMCIA cards that follow the 68-pin standard are widely available. However, as compact flash cards have become popular and are being used widely in mobile electronic devices such as palm-type computers, auto PC, digital cameras . . . etc., the peripheral components with PCMCIA interface cannot be connected to such electronic devices thereby making them become useless.

Therefore, it is an object of the present invention to provide a compact flash card adapter which allows a user to connect a peripheral component with PCMCIA interface with the compact flash card connector of an electronic device.

SUMMARY OF THE INVENTION

This invention is related to a compact flash card adapter and in particular to one that allows a user to connect a peripheral component with PCMCIA interface with the compact flash card connector of an electronic device.

According to a preferred embodiment of the present invention, a compact flash card adapter includes a casing, a printed circuit board fitted within the casing, a female compact flash card connector mounted on one side of the printed circuit board, a male PCMCIA card connector mounted on an opposite side of the printed circuit board, an indicator light installed on the printed circuit board and protruding out of the casing, a power switch arranged on the printed circuit board and protruding out of the casing, a power jack disposed on the printed circuit board and protruding out of the casing, and a voltage regulating IC mounted on the printed circuit board.

It is the primary object of the present invention to provide a compact flash card adapter that allows a user to connect a peripheral component with PCMCIA interface with the compact flash card connector of an electronic device.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts. Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

Figure 1:
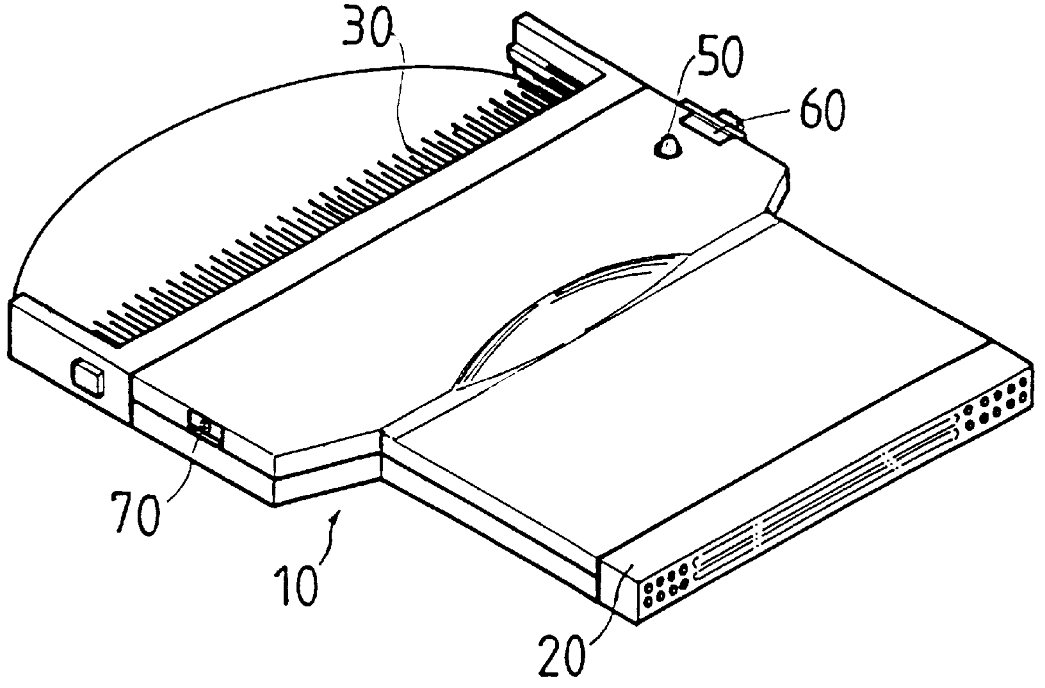
FIG. 1 is a perspective view of a compact flash card adapter according to the present invention.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 2:
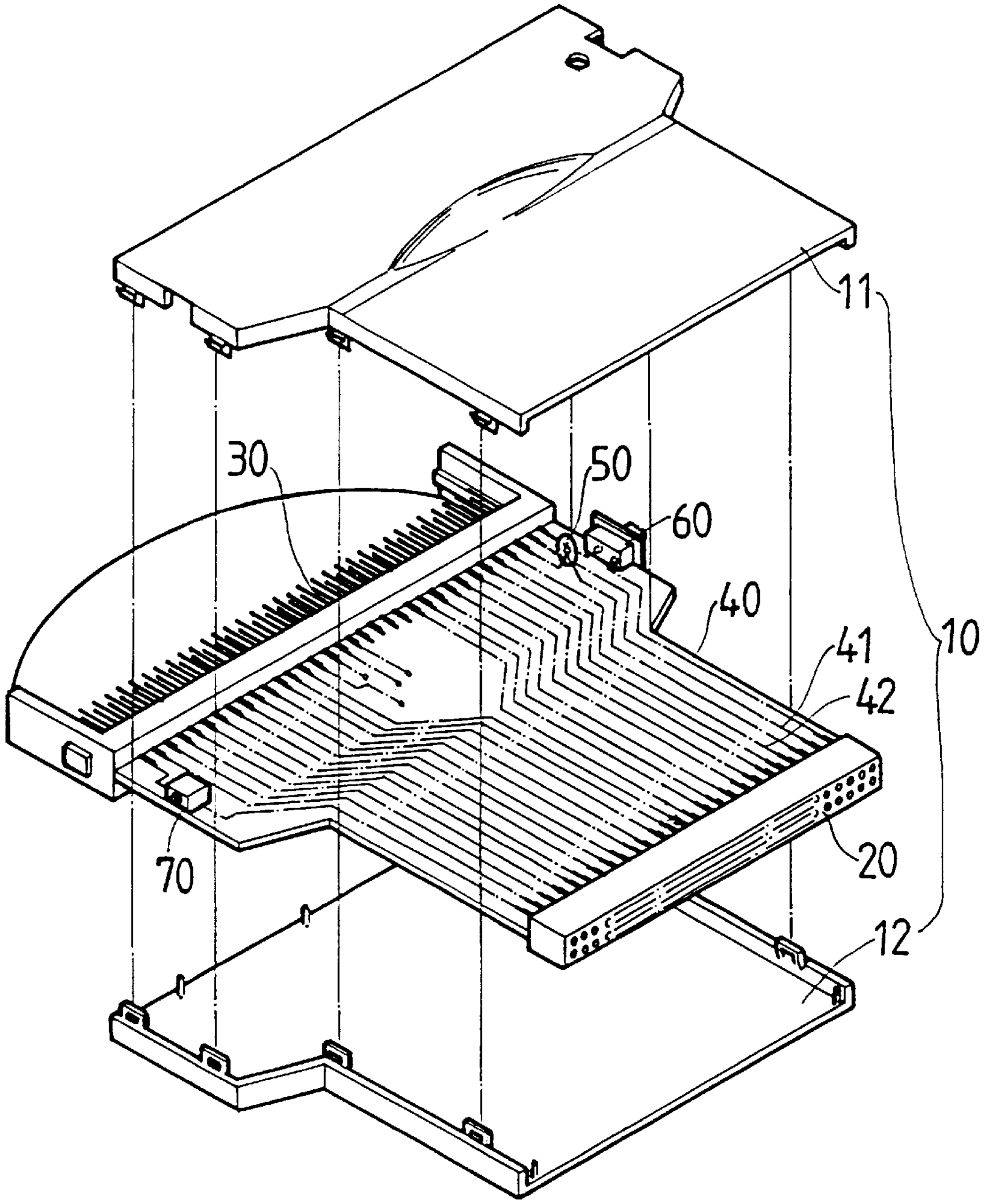
FIG. 2 is an exploded view of the compact flash card adapter.
Figure 3:
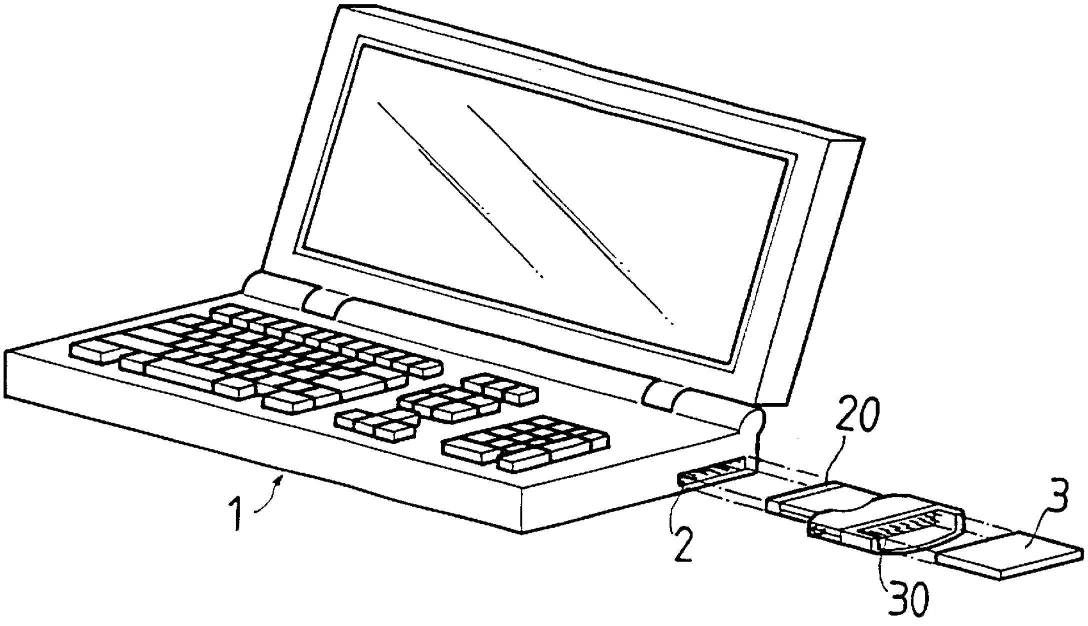
FIG. 3 is a working view of the present invention.

With reference to the drawings and in particular to FIGS. 1 and 2 thereof, the compact flash card adapter according to the present invention generally comprises a casing 10, a female compact flash card connector 20, a male PCMCIA card connector 30, a printed circuit board 40, an indicator light 50, and a voltage regulating IC 45, a power switch 60 and a power jack 70. The female compact flash card connector 20 is mounted on an end of the printed circuit board 40. The male PCMCIA card connector 30 is installed on another end of the printed circuit board 40. The female compact flash card connector 20 is connected to the male PCMCIA card connector 30 via wires 41 and 42. The indicator light 50, the voltage regulating IC 55, the power switch 60 and the power jack 70 are arranged on appropriate positions of the printed circuit board 40. The indicator light 50 is preferably a light-emitting diode for showing in what way the situation of the printed circuit board 40 is changing. The power switch 60 is used for selectively connecting an external direct current power or alternating current power, or connecting the power terminals of the female compact flash card connector 20 to the power terminals of the male PCMCIA card connector 30. The voltage regulating IC 45 is designed for obtaining the required voltage. The power jack 70 has the same structure as a socket for connecting a power transformer. The casing 10 is composed of an upper cover 11 and a lower cover 12, in which is mounted the printed circuit board 40, with the indicator light 50, the power switch 60 and the power jack 70 partially protruding out of the casing 10. The female compact flash card connector 20 has 50 holes, while the male PCMCIA card connector 30 has 68 pins (see FIGS. 1, 2 and 4). When in use, the female compact flash card connector 20 is connected with a male compact flash card connector 2 built in a notebook computer 1 so that a PCMCIA card 3 may be inserted in the male PCMCIA card connector 30 thereby allowing a user to connect a peripheral component with PCMCIA interface to connect with a male compact flash card connector 2 of an electronic device.

Figure 4:
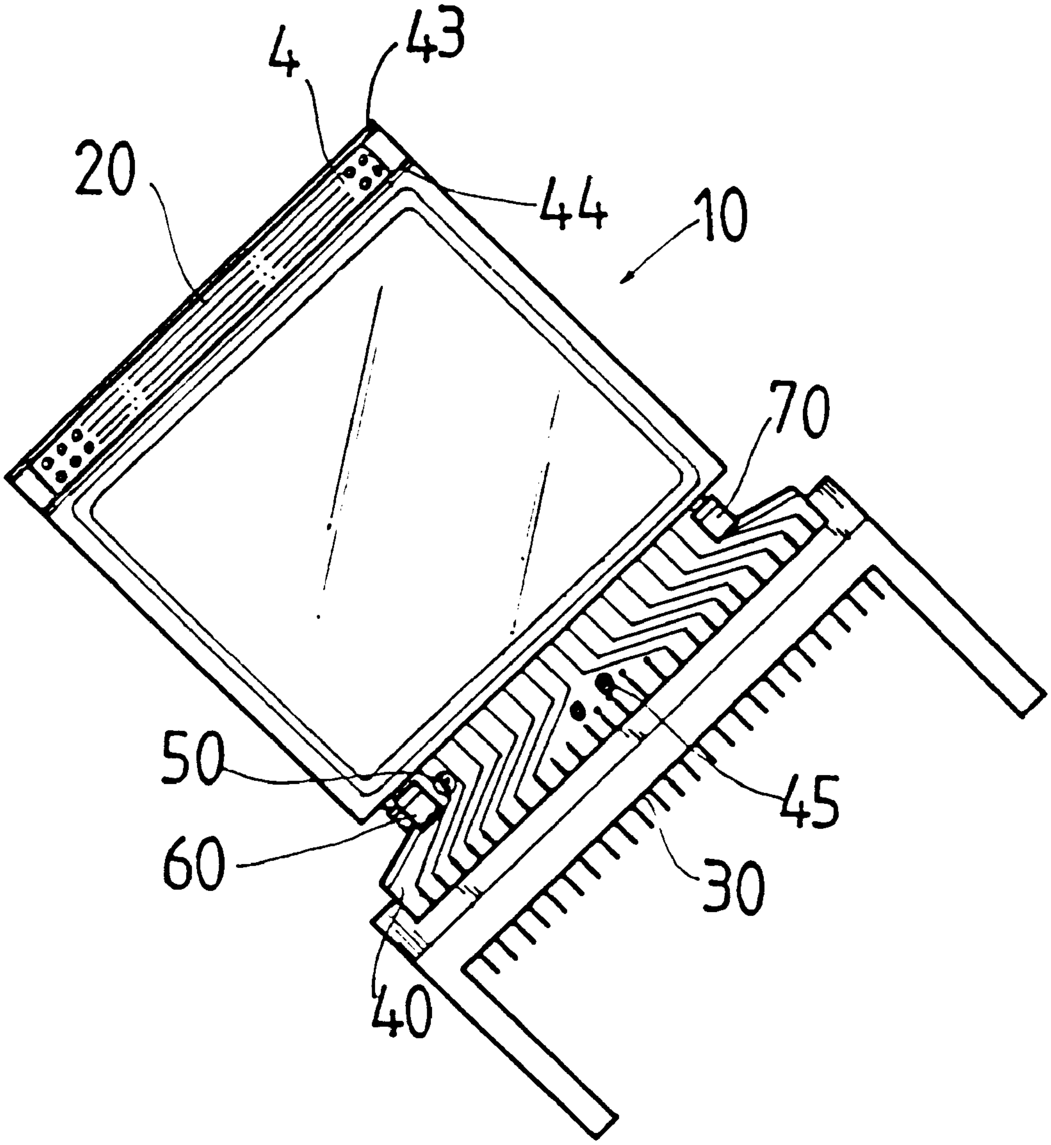
FIG. 4 illustrates another preferred embodiment of the present invention.

FIG. 4 illustrates another preferred embodiment of the present invention. As shown, an end of the skeleton of a standard compact flash card is used as a female compact flash card connector 20 and two covers 43 and 44 are mounted on two sides of the skeleton to form the casing 10. The opposite end of the skeleton of the compact flash card is connected with the printed circuit board 40 which is in turn connected with a male PCMCIA card connector 30. On the appropriate positions of the printed circuit board 40 are mounted the indicator light 50, the voltage regulating IC 45 (which may be arranged inside or outside of the connector as required), the power switch 60 and the power jack 70. On both sides of the printed circuit board 40 there is a rubber pad 45 for preventing the printed circuit board 40 from having a short circuit.

Figure 5:
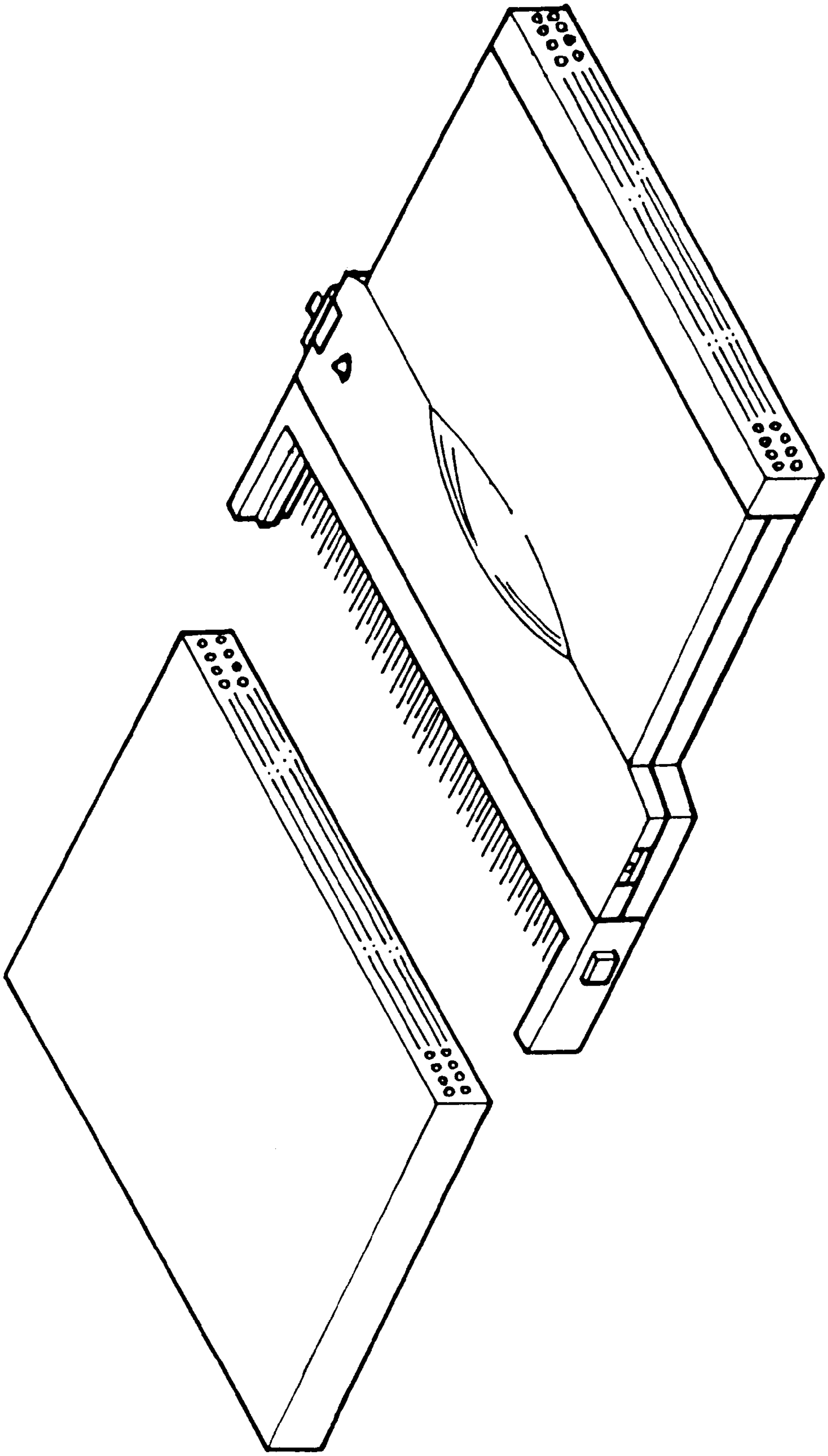
FIG. 5 illustrates another application of the present invention.

FIG. 5 illustrates another application of the present invention.

Accordingly, the compact flash card adapter according to the present invention allows a user to connect a peripheral component with PCMCIA interface to connect with a compact flash card connector of an electronic device.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A compact flash card adapter comprising:

a casing;

a printed circuit board fitted within said casing;

a female compact flash card connector mounted on one side of said printed circuit board;

a male PCMCIA card connector mounted on an opposite side of said printed circuit board and electrically connected with said female compact flash card connector;

an indicator light installed on said printed circuit board and protruding out of said casing;

a power switch arranged on said printed circuit board and protruding out of said casing;

a power jack disposed on said printed circuit board and protruding out of said casing; and a voltage regulating IC mounted on said printed circuit board.

2. The compact flash card as claimed in claim 1, wherein said casing is composed of an upper and a lower covers.

* * * * *